(12) United States Patent
Mokhlesi

(10) Patent No.: US 7,696,044 B2
(45) Date of Patent: Apr. 13, 2010

(54) METHOD OF MAKING AN ARRAY OF NON-VOLATILE MEMORY CELLS WITH FLOATING GATES FORMED OF SPACERS IN SUBSTRATE TRENCHES

(75) Inventor: Nima Mokhlesi, Los Gatos, CA (US)

(73) Assignee: SanDisk Corporation, Milpitas, CA (US)

( * ) Notice: Subject to any disclaimer, the term of this patent is extended or adjusted under 35 U.S.C. 154(b) by 673 days.

(21) Appl. No.: 11/533,317

(22) Filed: Sep. 19, 2006

(65) Prior Publication Data

US 2008/0070363 A1    Mar. 20, 2008

(51) Int. Cl.
*H01L 21/336* (2006.01)

(52) U.S. Cl. .................. 438/259; 438/266; 438/593; 257/E21.428

(58) Field of Classification Search .............. 438/266, 438/257, 262, 259, 593; 257/E21.428
See application file for complete search history.

(56) References Cited

U.S. PATENT DOCUMENTS

| | | | |
|---|---|---|---|
| 4,622,656 A | 11/1986 | Kamiya et al. | |
| 5,043,940 A | 8/1991 | Harari | |
| 5,070,032 A | 12/1991 | Yuan et al. | |
| 5,095,344 A | 3/1992 | Harari | |
| 5,172,338 A | 12/1992 | Mehrotra et al. | |
| 5,297,148 A | 3/1994 | Harari et al. | |
| 5,313,421 A | 5/1994 | Guterman et al. | |
| 5,315,541 A | 5/1994 | Harari et al. | |
| 5,331,189 A | 7/1994 | Chan et al. | |
| 5,343,063 A | 8/1994 | Yuan et al. | |
| 5,371,704 A | 12/1994 | Okazawa | |
| 5,570,315 A | 10/1996 | Tanaka et al. | |
| 5,656,544 A | 8/1997 | Bergendahl et al. | |
| 5,661,053 A | 8/1997 | Yuan | |
| 5,705,415 A * | 1/1998 | Orlowski et al. | ............ 438/259 |
| 5,712,180 A | 1/1998 | Guterman et al. | |
| 5,774,397 A | 6/1998 | Endoh et al. | |
| 5,786,612 A | 7/1998 | Otani et al. | |
| 5,874,760 A | 2/1999 | Burns, Jr. et al. | |
| 5,887,145 A | 3/1999 | Harari et al. | |
| 5,973,356 A | 10/1999 | Noble et al. | |
| 5,998,261 A * | 12/1999 | Hofmann et al. | ............ 438/257 |
| 6,046,935 A | 4/2000 | Takeuchi et al. | |
| 6,103,573 A | 8/2000 | Harari et al. | |
| 6,118,147 A | 9/2000 | Liu | |

(Continued)

OTHER PUBLICATIONS

EPO/ISA, "Invitation to Pay Additional Fees," corresponding International Patent Application No. PCT/US2007/078420, mailed on Mar. 20, 2008, 9 pages.

(Continued)

*Primary Examiner*—Michael Trinh
(74) *Attorney, Agent, or Firm*—Davis Wright Tremaine LLP

(57) ABSTRACT

In order to reduce the integrated circuit area that is occupied by an array of a given number of flash memory cells, floating gate charge storage elements are positioned along sidewalls of substrate trenches, preferably being formed of doped polysilicon spacers. An array of dual floating gate memory cells includes cells with this structure, as an example. A NAND array of memory cells is another example of an application of this cell structure. The memory cell and array structures have wide application to various specific NOR and NAND memory cell array architectures.

11 Claims, 6 Drawing Sheets

U.S. PATENT DOCUMENTS

| | | | |
|---|---|---|---|
| 6,124,608 A | 9/2000 | Liu et al. |
| 6,133,098 A | 10/2000 | Ogura et al. |
| 6,151,248 A | 11/2000 | Harari et al. |
| 6,222,762 B1 | 4/2001 | Guterman et al. |
| 6,232,632 B1 | 5/2001 | Liu |
| 6,248,633 B1 | 6/2001 | Ogura et al. |
| 6,255,689 B1 | 7/2001 | Lee |
| 6,281,075 B1 | 8/2001 | Yuan et al. |
| 6,512,263 B1 | 1/2003 | Yuan et al. |
| 6,522,580 B2 | 2/2003 | Chen et al. |
| 6,738,289 B2 | 5/2004 | Gongwer et al. |
| 6,815,758 B1 | 11/2004 | Chang et al. |
| 6,820,148 B1 | 11/2004 | Cedar et al. |
| 6,850,441 B2 | 2/2005 | Mokhlesi et al. |
| 6,888,755 B2 | 5/2005 | Harari |
| 6,925,007 B2 | 8/2005 | Harari et al. |
| 6,936,887 B2 | 8/2005 | Harari et al. |
| 6,952,034 B2 | 10/2005 | Hu et al. |
| 6,968,421 B2 | 11/2005 | Conley |
| 7,049,652 B2 * | 5/2006 | Mokhlesi et al. ............ 257/315 |
| 7,075,823 B2 | 7/2006 | Harari |
| 7,114,659 B2 | 10/2006 | Harari et al. |
| 7,152,801 B2 | 12/2006 | Cuellar et al. |
| 7,250,340 B2 | 7/2007 | Swift et al. |
| 2003/0109093 A1 | 6/2003 | Harari et al. |
| 2003/0137877 A1 | 7/2003 | Mokhlesi et al. |
| 2003/0185073 A1 | 10/2003 | Kim et al. |
| 2005/0045940 A1 | 3/2005 | Chen et al. |
| 2005/0072999 A1 | 4/2005 | Matamis et al. |
| 2005/0085040 A1 | 4/2005 | Forbes |
| 2005/0087796 A1 | 4/2005 | Jung |
| 2005/0151185 A1 | 7/2005 | Jung |
| 2005/0230483 A1 | 10/2005 | Miller et al. |
| 2005/0230484 A1 | 10/2005 | Cuellar et al. |
| 2005/0250335 A1 | 11/2005 | Huang et al. |
| 2005/0255647 A1 | 11/2005 | Forbes |
| 2005/0259467 A1 | 11/2005 | Forbes |
| 2005/0269626 A1 | 12/2005 | Forbes |
| 2006/0033144 A1 * | 2/2006 | Forbes et al. ............ 257/315 |
| 2006/0163644 A1 | 7/2006 | Bhattacharyya |
| 2006/0171209 A1 | 8/2006 | Sim et al. |
| 2006/0220093 A1 | 10/2006 | Van Schaijk et al. |
| 2006/0245245 A1 | 11/2006 | Mokhlesi et al. |
| 2007/0032025 A1 | 2/2007 | Brunco |
| 2007/0034963 A1 | 2/2007 | Sudo |
| 2007/0141780 A1 | 6/2007 | Higashitani |
| 2008/0067572 A1 | 3/2008 | Mokhlesi |
| 2008/0149996 A1 | 6/2008 | Mokhlesi |
| 2008/0153226 A1 | 6/2008 | Mokhlesi |

OTHER PUBLICATIONS

EPO/ISA, Notification of Transmittal of the International Search Report and the Written Opinion of the International Searching Authority, or the Declaration, corresponding International Patent Application No. PCT/US2007/078420, mailed on Jul. 16, 2008, 21 pages.

USPTO, "Office Action," mailed in related U.S. Appl. No. 11/533,313 on Jul. 10, 2008, 15 pages.

Hayashi et al., "Twin MONOS Cell with Dual Control Gates," 2000 Symposium on VLSI Technology Digest of Technical Papers, pp. 122-123.

IBM Corporation, "Vertical EEPROM Cell," IBM Technical Disclosure Bulletin, vol. 35, No. 4B, Sep. 1992, pp. 130-131.

Jung et al., "Patterning With Spacer for Expanding the Resolution Limit of Current Lithography Tool," Design and Process Integration for Microelectronic Manufacturing IV, edited by Alfred K. K. Wong, Proc. Of SPIE vol. 6156, 61561J, 2006, 9 pages.

Saito et al., "Split Gate Cell with Phonon Assisted Ballistic CHE injection," 2000 Symposium on VLSI Technology Digest of Technical Papers, pp. 126-127.

Stanley Wolf Ph.D., "Silicon Processing for the VLSI Era," Lattice Press, 1995, pp. vi-xxii, 595-598, 608-611, 634-638, total 32 pages.

Ogura et al., "A Novel Step Stack NOR Cell for Low Voltage Flash," 1998 Symposium on VLSI Technology Digest of Technical Papers, Jun. 9-11, 1998, pp. 106-107.

USPTO, "Office Action," mailed in related U.S. Appl. No. 11/533,313 on Jan. 15, 2008, 15 pages.

Book edited by Brown and Brewer, "Nonvolatile Semiconductor Memory Technology," IEEE Press, 1998, section 1.2, pp. 9-25.

Kamiya et al., "EPROM Cell with High Gate Injection Efficiency," IEDM Technical Digest, 1982, pp. 741-744.

Ogura et al., "Low Voltage, Low Current, High Speed Program Step Split Gate Cell with Ballistic Direct Injection for EEPROM/Flash", IEDM 1998, pp. 987-990.

USPTO, "Office Action," mailed in related U.S. Appl. No. 11/533,313 on Apr. 2, 2009, 13 pages.

* cited by examiner

METHOD OF MAKING AN ARRAY OF NON-VOLATILE MEMORY CELLS WITH FLOATING GATES FORMED OF SPACERS IN SUBSTRATE TRENCHES

CROSS REFERENCE TO RELATED APPLICATION

This application is related to an application Ser. No. 11/533,313, filed on Sep. 19, 2006, by Nima Mokhlesi, entitled "Array on Non-volatile Memory Cells With Floating Gates formed of Spacers in Substrate Trenches," now publication no. 2008/0067572 A1, which application is incorporated herein in its entirety by this reference.

BACKGROUND

This invention relates generally to non-volatile flash memory systems, and, more specifically, to a structure and process of forming arrays of memory cells that utilize substrate trenches to reduce the overall size of the arrays.

There are many commercially successful non-volatile memory products being used today, particularly in the form of small form factor cards, which use an array of flash EEPROM (Electrically Erasable and Programmable Read Only Memory) cells. Arrays with either a NOR or a NAND architecture are commonly used. One or more integrated circuit chips containing a memory cell array are commonly combined with a controller chip to form a complete memory system. Alternatively, part or all of the controller function may be implemented on the same chip that contains all or part of the memory cell array.

In one type of NOR array, each memory cell has a "split-channel" between source and drain diffusions. The floating gate of the cell is positioned over one portion of the channel and the word line (also referred to as a control gate) is positioned over the other channel portion as well as over the floating gate. This effectively forms a cell with two transistors in series, one (the memory transistor) with a combination of the amount of charge on the floating gate and the voltage on the word line controlling the amount of current that can flow through its portion of the channel, and the other (the select transistor) having the word line alone serving as its gate. The word line extends over a row of floating gates. Examples of such cells, their uses in memory systems and methods of manufacturing them are given in U.S. Pat. Nos. 5,070,032, 5,095,344, 5,315,541, 5,343,063, and 5,661,053, and 6,281,075.

A modification of this split-channel flash EEPROM cell adds a steering gate positioned between the floating gate and the word line. Each steering gate of an array extends over one column of floating gates, perpendicular to the word lines. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the floating gate to a desired level through an electric field (capacitive) coupling between the word line and the floating gate. It is often difficult to perform both of these functions in an optimum manner with a single voltage. With the addition of the steering gate, the word line need only perform function (1), while the added steering gate performs function (2). The use of steering gates in a flash EEPROM array is described, for example, in U.S. Pat. Nos. 5,313,421 and 6,222,762.

In one specific type of memory cell that efficiently utilizes integrated circuit area, two floating gates are included, each of which may be operated in binary (one bit per floating gate) or with multiple programming states (more than one bit per floating gate). The two floating gates are positioned over the substrate channel between source and drain diffusions with a select transistor in between them. A steering gate is included along each column of floating gates and a word line is provided thereover along each row of floating gates. When accessing a given floating gate for reading or programming, the steering gate over the other floating gate of the cell containing the floating gate of interest is raised sufficiently high to turn on the channel under the other floating gate no matter what charge level exists on it. This effectively eliminates the other floating gate as a factor in reading or programming the floating gate of interest in the same memory cell. For example, the amount of current flowing through the cell, which can be used to read its state, is then a function of the amount of charge on the floating gate of interest but not of the other floating gate in the same cell.

Examples of an array with dual floating gate memory cells, and operating techniques therefore, are described in U.S. Pat. Nos. 5,712,180, 6,103,573 and 6,151,248. The dual floating gate memory cell arrays are usually formed entirely on a surface of a semiconductor substrate. However, U.S. Pat. No. 6,151,248 additionally describes, primarily with respect to FIGS. 6 and 7 thereof, memory cells formed in a trench in the substrate surface and along surface areas of the substrate adjacent to the trench. U.S. Pat. No. 6,936,887 also describes an array of memory cells partially formed in substrate trenches.

The NAND array utilizes series strings of more than two memory cells, such as 16 or 32, connected along with one or more select transistors between individual bit lines and a reference potential to form columns of cells. Word lines extend across cells in a row direction, across a large number of these columns. An individual cell within a column is read and verified during programming by causing the remaining cells in the string to be turned on hard so that the current flowing through a string is dependent upon the level of charge stored in the addressed cell. Examples of NAND architecture arrays and their operation as part of a memory system are found in U.S. Pat. Nos. 5,570,315, 5,774,397, 6,046,935, 6,522,580, 6,888,755 and 6,925,007.

There are various programming techniques for causing electrons to travel through the gate dielectric from the substrate onto the floating gate. The most common programming mechanisms are described in a book edited by Brown and Brewer, "Nonvolatile Semiconductor Memory Technology," IEEE Press, section 1.2, pages 9-25 (1998). One technique, termed "Fowler-Nordheim tunneling" (section 1.2.1), causes electrons to tunnel through the floating gate dielectric under the influence of a high field that is established thereacross by a voltage difference between the control gate and the substrate channel. Another technique, channel hot electron injection in the drain region, commonly referred to as "hot-electron injection" (section 1.2.3), injects electrons from the cell's channel into a region of the floating gate adjacent the cell's drain. Yet another technique, termed "source side injection" (section 1.2.4), controls the substrate surface electrical potential along the length of the memory cell channel in a manner to create conditions for electron injection in a region of the channel away from the drain. Source side injection is also described in an article by Kamiya et al., "EPROM Cell with High Gate Injection Efficiency," IEDM Technical Digest, 1982, pages 741-744, and in U.S. Pat. Nos. 4,622,656 and 5,313,421. In a further programming technique, termed "ballistic injection" high fields are generated within a short channel to accelerate electrons directly onto the charge storage element, as described by Ogura et al., "Low Voltage, Low Current, High Speed Program Step Split Gate Cell with Ballistic Direct Injection for EEPROM/Flash", IEDM 1998, pages 987-990."

One of two techniques for removing charge from floating gate charge storage elements to erase memory cells are primarily used in both of the two types of memory cell arrays described above. One is to erase to the substrate by applying appropriate voltages to the source, drain, substrate and other gate(s) that cause electrons to tunnel through a portion of a dielectric layer between the floating gate and the substrate.

The other erase technique transfers electrons from the floating gate to another gate through a tunnel dielectric layer positioned between them. In the first type of cell described above, a third gate is provided for that purpose. In the second type of cell described above, which already has three gates because of the use of a steering gate, the floating gate is erased to the word line, without the necessity to add a fourth gate. Although this later technique adds back a second function to be performed by the word line, these functions are performed at different times, thus avoiding the necessity of making compromises to accommodate the two functions. When either of these erase techniques is utilized, a large number of memory cells are grouped together into blocks of a minimum number of cells that are simultaneously erased, in a "flash." In one approach, the individual blocks include enough memory cells to store the amount of user data stored in a disk sector, namely 512 bytes, plus some overhead data. Erasure of a number of blocks at once, defect management and other flash EEPROM system features are described in U.S. Pat. No. 5,297,148. In another approach, each group contains enough cells to hold several thousand bytes of user data, equal to 8, 16 or more host sectors' worth of data that are individually programmable and readable. Examples of operating such a large block memory are given in U.S. Pat. No. 6,968,421.

In place of electrically conductive floating gates, some flash memories utilize a non-conductive dielectric material that traps electrons. In either case, an individual memory cell includes one or more charge storage elements. Examples of the use of dielectric are described in aforementioned U.S. Pat. No. 6,925,007 and documents referenced therein. In the case of a dielectric trapped charge memory cell, two or more charge storage elements may be formed as two or more regions of a single continuous layer of dielectric that are spaced apart thereacross. One example of a suitable charge storage dielectric material is a three-layer oxide-nitride-oxide (ONO) composite. Another example is a single layer of silicon rich silicon dioxide material. As in almost all integrated circuit applications, the pressure to shrink the silicon substrate area required to implement some integrated circuit function also exists with flash EEPROM systems. It is continually desired to increase the amount of digital data that can be stored in a given area of a silicon substrate, in order to increase the storage capacity of a given size memory card and other types of packages, or to both increase capacity and decrease size. Another way to increase the storage density of data is to store more than one bit of data per memory cell. This is accomplished by dividing a window of a memory cell threshold voltage range into more than two states. The use of four such states allows each charge storage element to store two bits of data, eight states stores three bits of data per charge storage element, and so on. A multiple state flash EEPROM structure and operation is described in U.S. Pat. Nos. 5,043, 940 and 5,172,338, as examples.

SUMMARY OF THE INVENTION

An array of floating gate charge storage element memory cells is formed with the use of trenches or cavities in which the floating gates are positioned along sidewalls thereof, having a gate dielectric therebetween, and without overlying the substrate surface adjacent the trenches. That is, the floating gates remain within the area of the trenches in plan view. This is preferably accomplished by utilizing spacers as the floating gates, wherein a layer of floating gate material, such as conductively doped polysilicon, is isotropically deposited over the array and into the trenches, followed by anisotropically etching away all of the deposited floating gate material except for spacers that remain along the trench sidewalls. Conductive control gates can then be formed in the trenches between the floating gate spacers, and/or select transistors can be positioned in substrate surface areas adjacent the trenches, depending upon the exact configuration desired for the memory cells.

An overall advantage of this structure is its efficient use of substrate surface area. A significant portion of the length of the memory cell channel is vertically oriented along the trench walls, thus reducing the amount of substrate surface area required for each memory cell. Source and drain regions may be implanted into the bottoms of the trenches between the floating gates therein. This floating gate structure and method of forming floating gates may be used in a wide variety of types of flash memory arrays. If used to form a NOR array of dual floating gate memory cells, for example, each such cell is formed from two floating gates along sidewalls of adjacent trenches and a select transistor formed therebetween in the substrate surface. If used to form a NAND array, the series strings of memory cell transistors are formed along the trench sidewalls with connecting diffusions in the bottoms of the trenches between the floating gates therein and along the substrate surface between adjacent trenches.

One specific advantage of this positioning of floating gates along the walls of substrate trenches is that, in memory architectures where appropriate, the floating gates may be programmed by ballistic injection with increased efficiency. That is, electrons may be accelerated along the lengths of the substrate channels between trenches and parallel to the substrate surface onto the floating gates in a direct line path, impinging at a normal or near normal angle to an interface between the substrate trench sidewall and the tunnel dielectric sandwiched between the floating gate and the sidewall. Therefore, it is not necessary that the electrons be redirected by a scattering mechanism, which scattering occurs during use of the more usual source side injection and hot-electron injection programming mechanisms. By avoiding wrapping the floating gates out of the trenches and along the substrate surface, and by applying a voltage to the select gate that is slightly higher than the select gate's VT, a high lateral electric field is created which accelerates the channel electrons to kinetic energies sufficient to overcome the tunnel oxide barrier. Many of these hot electrons will impinge on the tunnel oxide without having to be first scattered in order to re-direct their momentum. The high voltage on the floating gate may also help accelerate the electrons along a path to the floating gate as they traverse the channel region. The walls of the trenches along which the floating gates are formed may be perpendicular to the substrate surface, which is optimum for efficient programming by ballistic injection and allows the size of the memory cell to be minimized, but this is not a requirement. Substrate trenches with perpendicular sidewalls are conveniently formed by anisotropically etching into the substrate surface.

Rather than forming floating gates as the memory cell charge storage elements, a dielectric charge trapping material may be substituted. The middle nitride layer of ONO, for example, can be deposited by use of the same spacer techniques. Uniform thickness layers of oxide are formed in a manner to be on either side of the nitride spacer to provide the ONO structure. Alternatively, spacers of silicon rich silicon dioxide can be formed in the same manner as the conductive floating gates, and the dielectric layers provided on either side of the floating gates need not be formed on such dielectric spacers.

Additional aspects, advantages, embodiments and features of the present invention are included in the following description of exemplary examples thereof, whose description should be taken in conjunction with the accompanying drawings.

All patents, patent applications, articles, book portion, other publications, documents and things referenced herein are hereby incorporated herein by this reference in their entirety for all purposes. To the extent of any inconsistency or conflict in the definition or use of terms between any of the incorporated publications, documents or things and the present application text, those of the present application text shall prevail.

DETAILED DESCRIPTION OF EXEMPLARY EMBODIMENTS

Memory System

Figure 1:
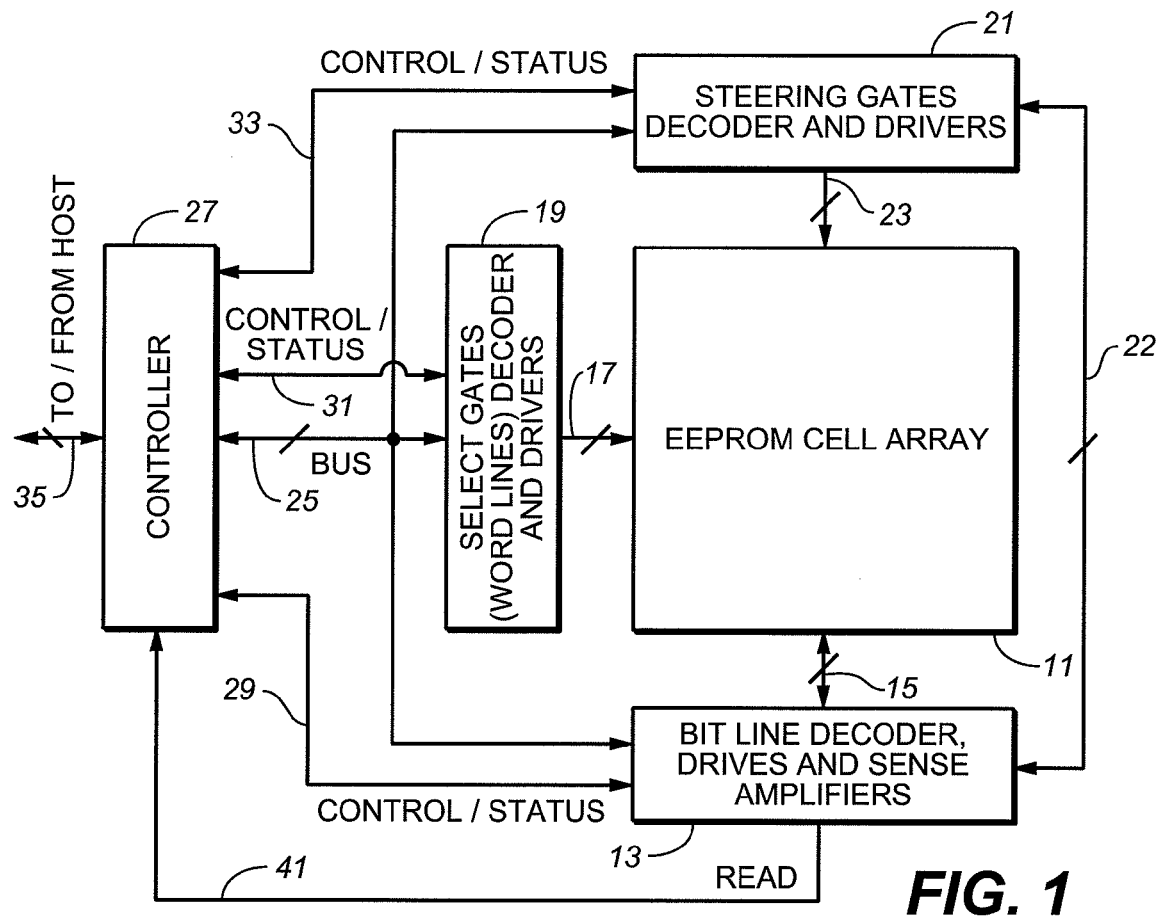
FIG. 1 illustrates in block diagram form a flash EEPROM system in which the various aspects of the present invention may be implemented.

An example memory system incorporating the various aspects of the present invention is generally illustrated in the block diagram of FIG. 1. A large number of individually addressable memory cells 11 are arranged in a regular array of rows and columns, although other physical arrangements of cells are certainly possible. Bit lines, designated herein to extend along columns of the array 11 of cells, are electrically connected with a bit line decoder and driver circuit 13 through lines 15. Word lines, which are designated in this description to extend along rows of the array 11 of cells, are electrically connected through lines 17 to a word line decoder and driver circuit 19. Steering gates, which extend along columns of memory cells in the array 11, are electrically connected to a steering gate decoder and driver circuit 21 through lines 23. Each of the decoders 13, 19 and 21 receives memory cell addresses over a bus 25 from a memory controller 27. The decoder and driving circuits are also connected to the controller 27 over respective control and status signal lines 29, 31 and 33. Voltages applied to the steering gates and bit lines are coordinated through a bus 22 that interconnects the decoder and driver circuits 13 and 21.

The controller 27 is connectable through lines 35 to a host device (not shown). The host may be a personal computer, notebook computer, digital camera, audio player, various other hand held electronic devices, and the like. The memory system of FIG. 1 will commonly be implemented in a card according to one of several existing physical and electrical standards, such as one from the PCMCIA, the CompactFlash™ Association, the MMC™ Association, The SD Group and others. When in a card format, the lines 35 terminate in a connector on the card which interfaces with a complementary connector of the host device. The electrical interface of many cards follows the ATA standard, wherein the memory system appears to the host as if it was a magnetic disk drive. Other memory card interface standards also exist. Alternatively to the card format, memory systems of the type shown in FIG. 1 are permanently embedded in the host device.

The decoder and driver circuits 13, 19 and 21 generate appropriate voltages in their respective lines of the array 11, as addressed over the bus 25, according to control signals in respective control and status lines 29, 31 and 33, to execute programming, reading and erasing functions. Any status signals, including voltage levels and other array parameters, are provided by the array 11 to the controller 27 over the same control and status lines 29, 31 and 33. A plurality of sense amplifiers within the circuit 13 receive current or voltage levels that are indicative of the states of addressed memory cells within the array 11, and provides the controller 27 with information about those states over lines 41 during a read operation. A large number of sense amplifiers are usually used in order to be able to read the states of a large number of memory cells in parallel. During reading and program operations, one row of cells is typically addressed at a time through the circuits 19 for accessing a number of cells in the addressed row that are selected by the circuits 13 and 21. During an erase operation, all cells in each of many rows are typically addressed together as a block for simultaneous erasure.

The bit line decoder and driver circuit 13 is connected through lines 15 with global bit lines, which are in turn selectively connected with the source and drain regions of the array. The sources and drains of columns of individual memory cells are connected to proper programming voltages for either reading or programming in response to addresses supplied over the bus 25 and control signals over the lines 19.

The steering line decoder and driver circuit 21 connects though lines 23 to the steering gates and is able to individually select steering lines and control their voltages in response to addresses provided on the bus 25, control signals in the lines 33, and data from the drivers and sense amplifiers 13.

The select gate decoder and driver circuit 19 is connected with the word lines in order to individually select one row of the cell array. Individual cells within a selected row are then enabled for reading or writing by the bit line and steering gate decoder and driver circuits 13 and 21.

Operation of a memory system such as illustrated in FIG. 1 is further described in patents identified in the Background section above, and in other patents assigned to SanDisk Corporation, assignee of the present application. In addition, U.S. Pat. No. 6,738,289 describes an example data programming method.

Exemplary Embodiment of a Dual Floating Gate Memory Cell Array

Figure 2:
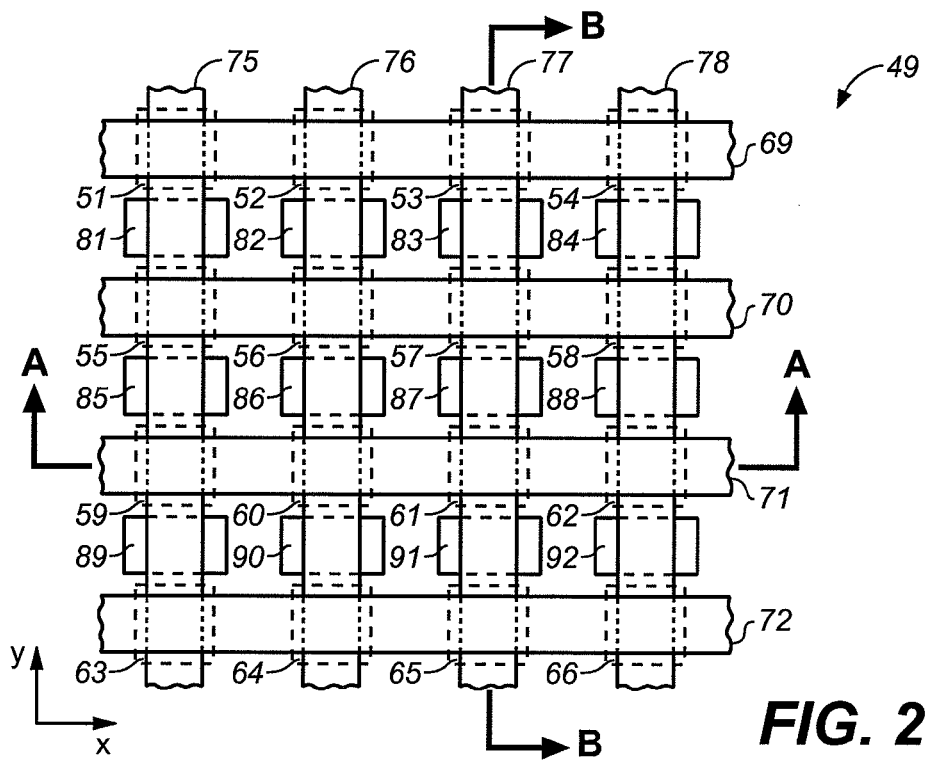
FIG. 2 is a plan view of a partially constructed dual floating gate memory cell array.
Figure 3A:
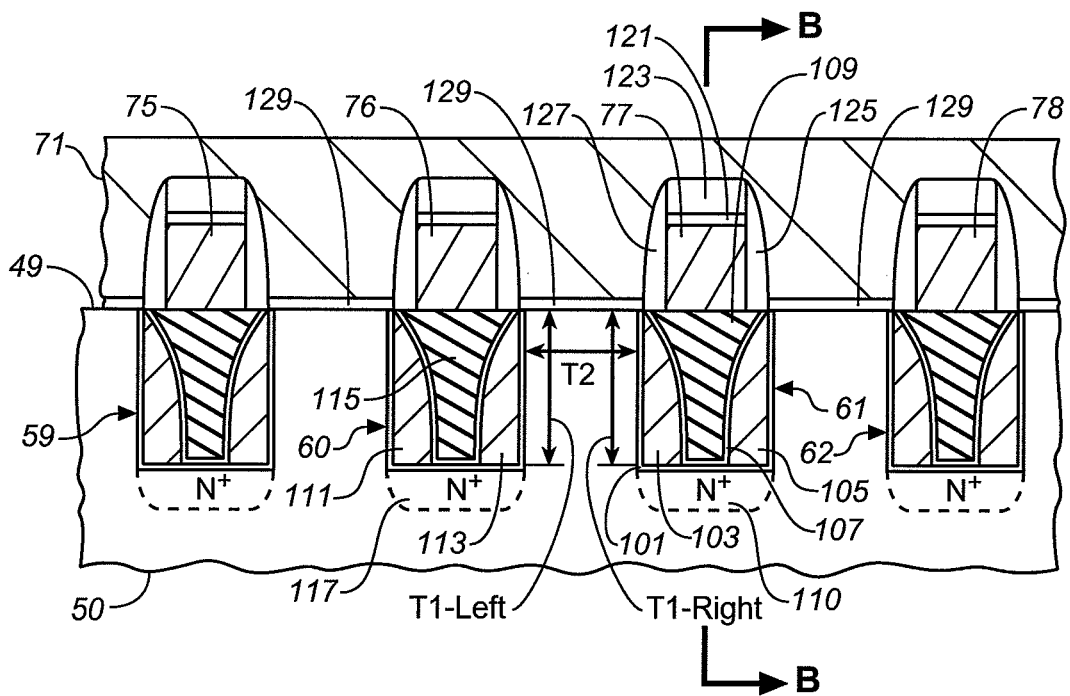
FIGS. 3A and 3B are sectional views of one embodiment of the structure of FIG. 2, taken at sections A-A and B-B thereof, respectively.
Figure 3B:
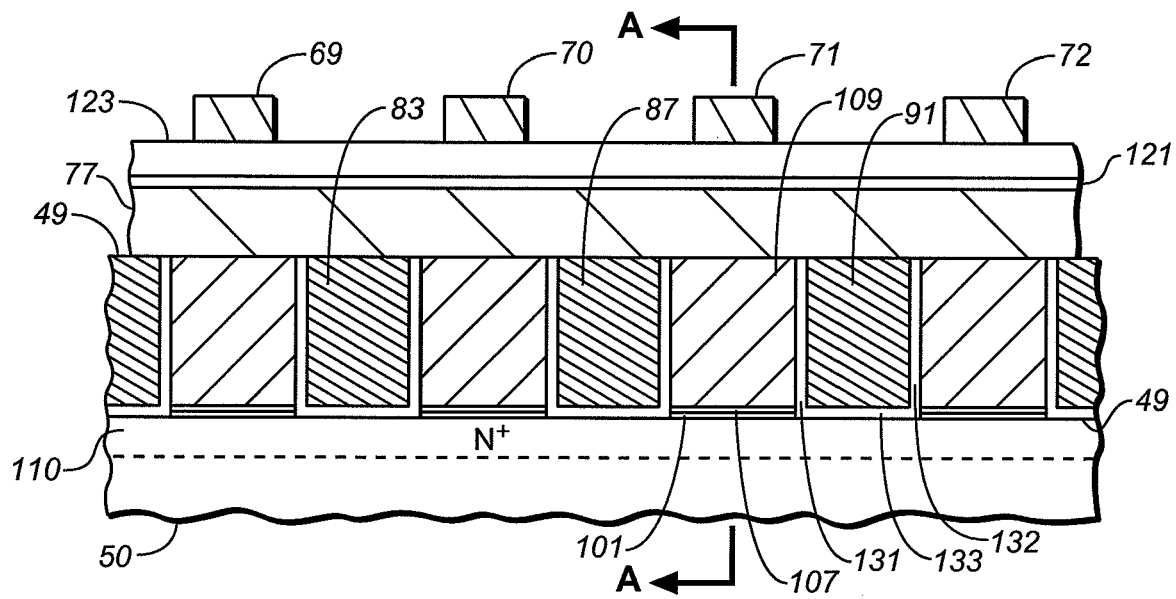
Figure 4:
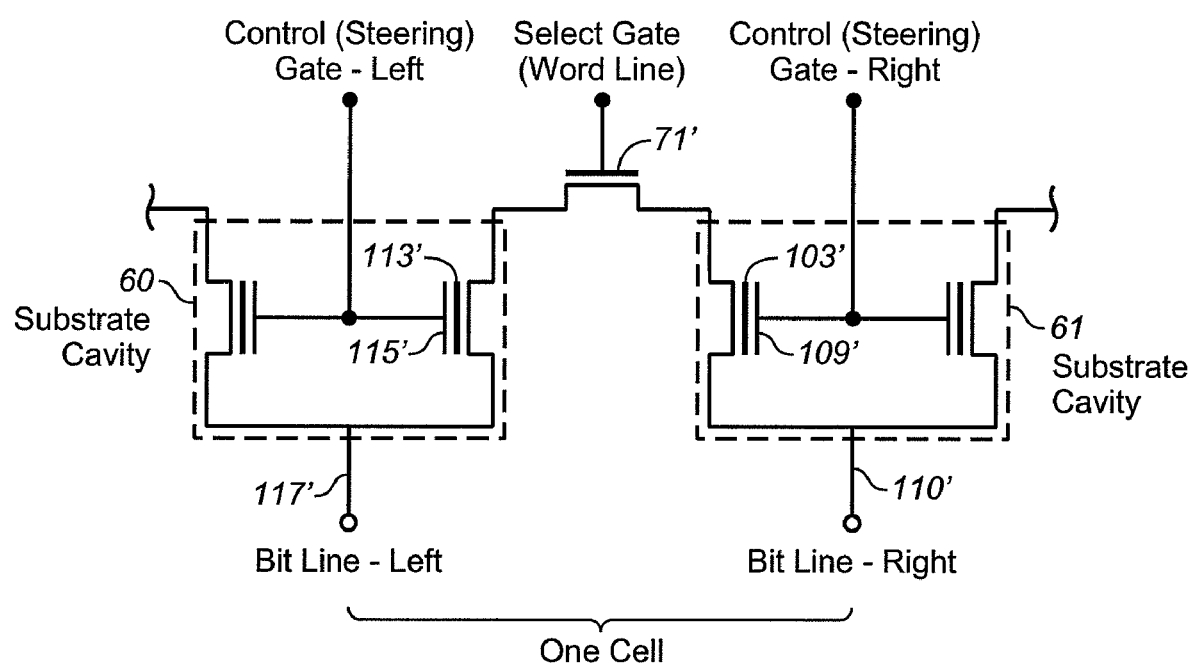
FIG. 4 is an equivalent circuit diagram of a dual floating gate memory cell of the array of FIGS. 2, 3A and 3B.

The structure of an example NOR memory array formed on a single integrated circuit chip with the floating gates formed by a spacer technique is illustrated in FIGS. 2, 3A and 3B, and an equivalent circuit of the resulting memory cell is given in FIG. 4. Referring primarily to the plan view of FIG. 2, a two-dimensional array of trenches 51-66 are formed in a surface 49 of a semiconductor substrate 50, preferably by initially etching long parallel trenches and then defining the shortened trenches 51-66 within them. These trenches are crossed by two sets of electrically conductive control gate lines, word lines 69-72 having lengths extending in the x-direction and steering gate lines 75-78 having lengths extending in the orthogonally oriented y-direction. Optionally but preferably, an array of conductive shields 81-92 are formed in recesses in the surface 49 of the substrate 50 between neighboring ones of the trenches 51-66 in the y-direction. Each shield is electrically connected with one of the steering lines 75-78 passing over it. These conductive shields and surrounding dielectric are periodically placed along initially formed elongated trenches to form the defined length trenches 51-66 in which the floating gates are positioned.

The components formed in the trenches 51-66 are illustrated in FIGS. 3A and 3B, which are cut-away views of FIG. 2 taken along orthogonally oriented sections A-A and B-B thereof, respectively. Each of the trenches 51-66 includes memory cell floating gates, a select gate and layers of dielectric. Taking the trench 61 as typical, a layer 101 of dielectric material covers the walls and bottom surface of the trench. The layer 101 is preferably made of silicon dioxide ($SiO_2$ for example). Two conductive floating gates 103 and 105 are formed as spacers along opposite sidewalls of the trench in the x-direction. Enough space is left in the x-direction between the floating gates for a layer 107 of dielectric and a steering gate 109 that fills this space. The dielectric layer 107 is preferably made of three layers, two layers of silicon dioxide on opposite sides of a layer of silicon nitride ($Si_3N_4$ for example), in a structure commonly referred to as "ONO". It will be noted that the ONO layer is confined to regions between the floating and steering gates, and avoids the channel areas. This improves the endurance of the memory cell and reduces noise and disturb phenomena that can be caused by its nitride layer trapping charge over time.

The gates 103, 105 and 109, the dielectric layer 101 along the sidewalls and the intermediate dielectric layer 107 together fill the trench 61 in the x-direction. A buried N+ diffusion 110 is elongated in the y-direction and positioned under trenches 53, 57, 61 and 65, providing source and drain regions for the memory cells of which they are a part. The remaining trenches include the same structure and form. As identification for use below, the neighboring trench 60 includes floating gates 111 and 113, a steering gate 115 and dielectric layers positioned in the same manner as in the trench 61. A buried diffusion 117 exists under the trench 60 and other trenches in the same column.

The floating gates are preferably formed by depositing polysilicon material over the entire memory cell array being formed including within the trenches, and then anisotropically etching that layer until the spacers, such as floating gate spacers 103 and 105, remain within the trenches. A chemical-mechanical-polishing (CMP) step may be performed to remove any portion of the floating gate spacer material that may remain on the substrate surface 49. In this embodiment, the resulting floating gates are positioned entirely within their respective trenches, below the substrate surface 49. The steering gates 109 and 115 are also conveniently positioned entirely within their trenches below the substrate surface 49.

Conductive control gate lines are positioned across the trenches, over the substrate surface 49. The steering gate lines 75-78 extend across the trenches in the y-direction, making contact with the steering gates in the trenches and conductive shields between the trenches. The line 77, for example, extends across and electrically contacts the steering gate 109 and the other steering gates in that column, as well as contacting the intermediate conductive shields 83, 87 and 91. An isolating layer of dielectric (not shown) will be positioned between the steering gate lines and any portions of the substrate surface 49 that are crossed by those lines. Dielectric material surrounds the steering gate lines. The line 77, for example, has two dielectric layers 121 and 123 positioned on its top surface and coextensive with that surface. The layer 121 is preferably made of silicon dioxide and the layer 123 of silicon nitride. Spacers 125 and 127 are formed along the sidewalls in the x-direction of the conductive line 77 and dielectric strips 121 and 123 on top of the line 77.

The word lines 69-72 are positioned across the dielectric enclosed steering gate lines, perpendicular thereto. Because of the thicknesses of the intermediate dielectric, there is little or no coupling between the word and steering gate lines. The word lines are further separated from the substrate surface between the trenches in the x-direction by a layer 129 of gate dielectric, preferably silicon dioxide. Regions of the word lines adjacent the gate dielectric 129 form select gates of the memory cells. Channel regions of select transistors exist in the substrate surface 49 on opposite sides of the gate dielectric layers 129 between trenches.

The shields are surrounded by dielectric, such as layers 131 and 132 along sidewalls of the shield 91 that separate it from edges of the floating gates on either side in the y-direction and a layer 133 between a bottom surface of the shield 91 and the substrate surface 49. The bottom layer 133 is made relatively thick to minimize coupling between the shield 91 and the substrate surface 49. The side layers 131 and 132, on the other hand, are made relatively thin to maximize coupling between the shield 91 and edges of the floating gates on either side of the shield. Since the shield 91 is electrically connected with the steering gate line 77, this provides an increased area of coupling between each steering gate and the floating gates in the same column as the steering gate. Memory cells with an increased coupling ratio couple a larger percentage of the voltage placed on a steering gate to a floating gate with which it is capacitively coupled. At the same time, coupling between the floating gates and the buried bit line diffusions can be kept small, as can be seen from FIG. 3A, because of the thin floating gates in the x-direction.

One specific example configuration for array of FIGS. 2, 3A and 3B includes continuous trenches formed in the substrate in both the x- and y-directions, thus crossing each other. The floating and steering gates are positioned in the trenches elongated in the y-direction between the x-direction trenches. The shielding elements are positioned in the trenches elongated in the x-direction where they intersect with the y-direction trenches. A suitable field dielectric material then fills the x-direction trenches between the shielding elements.

The example structure of FIGS. 2, 3A and 3B utilizes doped polysilicon or other suitable conductive material formed from five separate depositions of material at different points in the process. In the process embodiment described below, the floating gates are formed from one, the steering gates from the second, the shielding elements from the third, the steering gate lines from the fourth and the word lines from the fifth deposition of conductive material. The polysilicon may be doped while being deposited, or, alternatively, may be deposited without doping and then ions implanted after the deposition. The last layer of polysilicon from which the word lines are formed may be silicided in order to reduce the resulting word line resistance, or have metal bonded to its top surface for this purpose. Alternatively, the word lines may be formed entirely from a metal as the fifth layer.

FIG. 4 is an equivalent circuit of one memory cell of FIGS. 3A and 3B, the same reference numbers being used with a prime (') added. Three transistors are connected in series between the buried bit line diffusions 110' and 117'. A storage transistor on the left includes the floating gate 113' and the storage transistor on the right contains the floating gate 103'. In between these storage transistors is a select transistor having a control gate 71'. The array of memory cells illustrated here may be operated in essentially the same manner as the dual floating gate memory cell array of the aforementioned U.S. Pat. No. 6,151,248.

As indicated in FIG. 3A, the substrate channel of this one memory cell is divided into three segments. One segment (T1-left) is along a vertical sidewall of the trench 60 adjacent to the floating gate 113, between the diffusion 117 and the substrate surface 49. This is part of the left storage transistor of the memory cell being described. The next segment (T2) is along the substrate surface 49 between walls of neighboring trenches 60 and 61. The third segment (T1-right) is along a vertical sidewall of the trench 61. The trenches may be formed as small in x- and y-dimensions across the substrate surface as the processing allows. The result is a very compact array of memory cells in the x-direction across the substrate surface. The amount of integrated circuit area per memory cell is thus made very small. The density of memory cells is potentially doubled from the case where the floating gates are positioned across the substrate surface, given the same processing scale. At the same time, the select gate channel length (T1 distance) may be increased slightly and the floating gate channel length (T1) may be significantly increased.

The preferred programming mechanism for the memory cells shown in FIGS. 3A and 3B is ballistic programming. That is, electrons are accelerated within the T2 region of the channel in a direction substantially parallel to the substrate surface 49 by appropriate voltages being applied to the word lines, select gate lines, the buried bit line diffusions and the substrate. The path of the high velocity electrons strikes one of the floating gates 103 or 113 substantially perpendicularly to its broad planar surface, depending upon which floating gate is being programmed. The programming efficiency is potentially orders of magnitude higher than the more standard source side injection. It is preferable that no part of the floating gate overlaps the substrate surface 49 in the T2 region, thereby freeing the T2 region of field effects that can interfere with this direct high energy electron path. The sidewalls of the trenches as shown in FIG. 3A are preferably vertical (perpendicular to the substrate surface 49), as shown, for the most efficient ballistic programming, but may alternatively be sloped somewhat if that is more convenient for other reasons.

There are several possibilities for removing charge from the floating gates to erase the memory cells, three of which are mentioned here. One is to cause electrons to tunnel through the select gate dielectric 129 from the relatively sharp top edge of the floating gate to the adjacent word line 71. A high erase voltage is placed on the word line for this. Alternatively, a floating gate may be erased to its vertical channel portion through the floating dielectric layer along a vertical face of the trench. For this, a voltage in the range of zero to −0.5 volts is applied to the bit line (alternatively the bit line can be allowed to float to prevent the possibility of also erasing to the bit line), zero volts is applied to the substrate and up to −20 volts is applied on the steering gate. Another possibility is to erase between the bottom of a floating gate and a buried diffusion bit line under the bottom of the trench, through the floating gate dielectric layer on the bottom of the trench. Example voltages include 5 volts on the bit line, 0 volts on the substrate and up to −15 volts on the steering gate. This last alternative has an advantage of not erasing through either of the floating gate or select gate dielectric layers, thus avoiding trapping charge in these layers over time from many erase operations that will usually affect programming and reading.

It will be noted that the memory cell array of FIGS. 2, 3A and 3B provides shielding between neighboring floating gates in both the x- and y-directions. Since the steering gates extend between floating gates in the same trench to the bottom of the trench, the steering gates provide shielding in the x-direction. In the y-direction, the shielding elements 81-92 provide such isolation. The field coupling of charge on one floating gate to a neighboring floating gate, which can be a source of read errors, is thereby significantly reduced.

Process of Making the Dual Floating Gate Memory Cell Array

One set of process steps (recipe) for making the memory cell array of FIGS. 2, 3A and 3B will now be described. An early step is the implantation of ions, such as of boron, into a blank substrate from the surface upon which the array is to be formed. Several implants of various energies and doses allow control of the doping level along the resulting vertical channel portions T1. The vertical orientation of the floating gate portions of the channel allows such selective doping along the channel length to be accomplished with relative ease and reliable results. It may be desirable, for example, to provide the highest ion concentration at a depth that coincides with the midway point along the floating gate channel length T1. This would make the threshold voltage VT the highest at the midpoint compared to any other point along the channel length T1, forming a bottleneck point that is more strongly controlled by the floating gate rather than by the buried bit line diffusions or the select gates. To the extent that the bottleneck point governs behavior of the memory cell, placing it at the mid-point of T1 keeps it away from both the upper region where ballistic electron injection occurs and the lower region where tunneling to the buried bit line diffusion may be chosen for erase.

A negative ion gradient with increasing depth may be installed near the substrate surface, which is beneficial for enhancing generation of hot electrons used during programming. Further, control of the doping level at the corners of the channels, where gaps exist between the select gates and the floating gates, can result in the gaps not dominating behavior of the memory cell.

After the implants, a thin silicon oxide layer is grown over the region of the surface of the substrate where the array is being formed. This serves as a buffer for a layer of silicon nitride that is next deposited over the oxide layer. The nitride layer is then masked and etched into a pattern of strips having lengths extending in the y-direction, preferably with a minimum width and spacing between them in the x-direction as is possible with the lithography and other aspects of the particular process being used. Areas of the substrate surface and thin oxide layer between the nitride strips are then anisotropically etched away with the nitride strips serving as a mask. Trenches with substantially vertical walls are formed in the substrate by this etching step to a depth slightly greater than the desired floating gate vertical channel length T1. Each column of the trenches 51-66 (FIG. 2) is eventually formed in one of these trenches.

A thick layer of oxide is then isotropically deposited over the entire region of the array over the nitride strips and into the trenches. This oxide layer is then anisotropically etched to leave oxide spacers along the common sidewalls of the trenches and nitride strips. The thickness of the deposited oxide layer and the etching are chosen to leave a narrow space between the spacers in the x-direction. These spacers and nitride strips are then used as an implant mask. Buried N+ implants, using arsenic for example, of various energies are made into the bottoms of the trenches through this mask between the spacers. The bit line diffusions are thus formed as strips extending along the bottoms of the trenches in the y-direction. The implanted ions later diffuse outward in the x-direction as a result of further processing steps at elevated temperatures, forming the bit line diffusions 110, 117 et al. shown in FIGS. 3A and 3B.

The oxide spacers, nitride strips and oxide under them are then all etched away. An oxide layer is then grown over the entire memory array area to a thickness of 8 nm to 10 nm, following the stepped contour of the substrate surface. The portions of this layer within the trenches eventually become the oxide layer 101 of FIGS. 3A and 3B. A first polysilicon layer (Poly1) is then isotropically deposited over the array area to a thickness of from 1 nm to 20 nm. This layer is then anisotropically etched back to leave spacer strips that extend continuously along the trench sidewalls in the y-direction and are spaced apart in the x-direction within the trenches. Portions of the lengths of these polysilicon strips are later removed to leave the spacer floating gates of the array.

An ONO layer is then formed over the array area, the portions over the polysilicon spacer strips that remain as floating gates forming the inter-poly dielectric layer 107 of FIGS. 3A and 3B. To form the ONO layer, a 5-6 nm thick oxide layer is first deposited, grown or both. A 5-7 nm nitride layer is then deposited over the oxide layer. A final 5-6 nm thick oxide layer is then grown, deposited or both over the nitride layer. A high temperature oxide densification step may be performed after forming each of the oxide layers. Alternatively, this may be omitted if later high temperature annealing steps are included in the process as they also perform the densification task.

A second layer of polysilicon (Poly2) is isotropically deposed over the array area to a thickness sufficient to completely fill the trenches between the ONO coated strips of Poly1. A CMP step is then performed to remove all material down to the substrate surface. This leaves strips of Poly2 extending in the y-direction, which, when later separated, form the steering gates 109, 115 et al. of FIGS. 3A and 3B.

The next several steps form a nitride mask and use that mask to etch the Poly 1 and Poly 2 strips, the dielectric layers surrounding them and the substrate in strips having lengths extending in the x-direction. The depth of the resulting x-direction trenches is preferably the same as the earlier floating gate trenches etch. A non-preferential etch is preferred so that each of Poly1, Poly2, oxide layer, ONO layer and silicon substrate are etched at about the same rate. It is in these trenches that the shielding elements 51-66 (FIG. 2) are later formed. This etch separates the Poly1 and Poly2 strips as shown in FIGS. 3A and 3B. And because the resulting steering gates are isolated from each other in the y-direction, the steering gate lines 75-78 (FIGS. 2, 3A and 3B) are later formed to connect them together in columns.

Next, a dielectric layer is formed over the array area, such as by both growing an oxide layer and isotropically depositing oxide to result in the dielectric layers 131, 132 and 133 (FIG. 3B) of unequal thicknesses within the x-direction trenches. A third layer of polysilicon (Poly3) is then deposited over this oxide, into the x-direction trenches. The area is then again subjected to CMP to remove the polysilicon and oxide down to the substrate surface. Remaining are strips of Poly3 extending in the x-direction, wholly within the x-direction trenches, and the oxide that separates the Poly 3 strips from the substrate trench walls. These Poly 3 strips are later separated to leave the shields 81-92.

Indeed, a next series of steps performs this separation. It is preferable that the lengths of the resulting shields in the x-direction be greater than the widths of the adjacent trenches 51-66, as is the case in the plan view of FIG. 2, although they could alternatively be made the same size. To do so means that segments of the Poly 3 strips need to be removed that are smaller than the line width of the process being used. Therefore, an etch mask is first formed over the array area with openings according to the process line width aligned over the regions of the Poly3 strips to be removed. Spacers are then formed along at least the edges of these openings in the y-direction to narrow the opening. Portions of the Poly3 strips exposed through these restricted openings are then removed by an anisotropic etching step, thereby leaving the individual shields 81-92.

A next series of steps forms the steering gate lines 75-78. A fourth layer of polysilicon (Poly4) is deposited over the area of the array. An etch mask is then formed over the Poly4 layer in the form of strips extending in the y-direction to cover portions of the layer that are to remain and become lines 75-78. Since this mask is not aligned with other elements previously formed, it is desirable to make the widths of the remaining Poly4 strips narrower than the line width of the process. Some degree of misalignment in the x-direction can then be tolerated.

These narrow mask openings may be obtained by first forming an oxide mask over the Poly4 layer with strips having widths and spaces between them in the x-direction equal to the minimum line width of the process being used. Spacers of oxide material are then formed along the edges of the openings to narrow them. A nitride layer is then deposited over the oxide material and onto the Poly4 layer through the narrowed openings between the oxide spacers. This structure is then subjected to CMP down to the oxide material, thereby leaving nitride strips extending in the y-direction with widths of the desired steering gate lines. The oxide material between the nitride strips is then removed by a selective etch. The Poly4 layer is then anisotropically etched through the resulting nitride mask to remove material from the Poly4 layer except where the nitride strips exist. The result is the steering gate lines 75-78.

The nitride masking strips are preferably left in place on the Poly4 strips, as shown in FIGS. 3A and 3B. Oxide spacers are then formed along sides of the stack of Poly4 and nitride strips in order to provide sufficient isolation between the Poly4 strips (steering gate lines) and the word lines to be formed over them. The added height to the stack provided by the nitride layer results in the spacers (125, 127 et al. of FIG. 3A) to reach a sufficient thickness in the region of the Poly4 strip (steering gate line 77 et al. of FIG. 3A).

Next, a layer of oxide is grown, deposited or both, in order to form the select gate dielectric layer 129 (FIG. 3A) on the exposed surface of the substrate. A fifth layer of polysilicon (Poly5) is then deposited over the array area from which the word lines 69-72 are formed. The Poly5 layer may be separated into word lines narrower than the minimum line width of the processing being used in the same manner as described above for forming the narrow steering gate lines 75-78 from the Poly4 layer. This mask is, of course, oriented with its strips extending in the x-direction. This process of narrowing the widths of the resulting polysilicon strips then allows some misalignment of the resulting Poly5 lines in the y-direction.

Further steps (not shown) include forming a first set of metal lines separated by dielectric layers that are periodically connected to the polysilicon steering gate lines 75-78 along their lengths, and a second set of metal lines connected along the lengths of the word lines 69-72, according to standard processing technology.

Alternative Embodiments of a Dual Floating Gate Memory Cell Array

Figure 5:
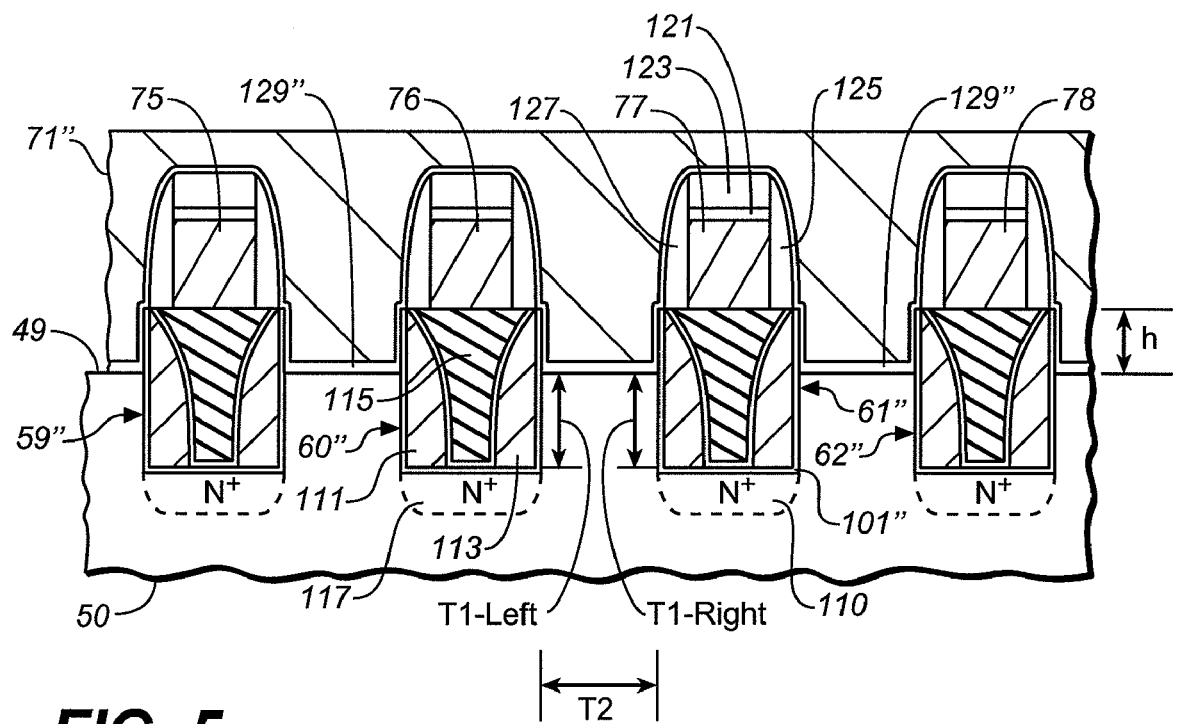
FIG. 5 is a sectional view of another embodiment of the structure of FIG. 2, taken at section A-A thereof.

There are many modifications that may be made to the architecture and process described above that retain their advantages and provide others. One modification is to make the trenches in the substrate shallower than shown in FIGS. 3A and 3B, and then extend the floating and steering gate structures out of the trenches a distance above the substrate surface and any control gate dielectric material formed on the substrate surface. Such a memory cell array is shown in FIG. 5, which is a cross-sectional view corresponding to that of FIG. 3A for the embodiment described above. Elements of the structure shown in FIG. 5 that are the same or essentially the same are identified by the same reference numbers as in FIG. 3A, and different elements with the same reference number as their counterparts but with a double prime (") added.

A primary advantage of the embodiment of FIG. 5 is that the lengths of the substrate channel portions T1-left and T1-right opposite the floating gates of the memory cell are reduced without reducing the coupling area between the floating gates and the steering gate if these gates remain the same size. This desirably increases the cell's floating gate to steering gate coupling ratio, since the amounts of capacitive coupling between each of the floating gates and the substrate are in the denominator of that ratio and the level of coupling between the floating and steering gates is in the numerator. The select transistor channel length T2 need not be affected.

Another advantage of the FIG. 5 structure is the increased overlap between each of the floating gates and the word line. More area of the floating gate 113, for example, lies opposite the word line 71". This makes it possible to increase the coupling between the floating gates and the word lines, depending upon the nature and thickness of the dielectric therebetween. This allows the word lines to be used to couple voltages to the floating gates during erase either to the buried bit line diffusion or to the substrate channel, thereby enhancing erase. The word lines may then also be used to assist in controlling the voltage of the floating gates during programming, such as by providing a minimum floating gate voltage required to initiate programming of the floating gates in the row of a word line.

Further, increased coupling between the word line and the floating gates in its row allows the word line to be driven with an alternating current (AC) signal during read and verify operations of in its row in order to reduce noise. This technique is described in U.S. Pat. No. 6,850,441.

It will be noted from FIG. 5, similar to the embodiment of FIGS. 3A and 3B, that the steering gate lines, such as the line 76, extend across the array in the y-direction, in electrical contact with the steering gates and intermediate shielding elements it crosses, such as the steering gate 115 and the shielding elements 86 and 90 (FIG. 2) on either side of the trench 60 (60" in FIG. 5) that contains the steering gate 115. Since the shielding elements are formed with top surfaces at or below the substrate surface 49 (see FIG. 3B), the raised gate structure of FIG. 5 causes the steering gate lines 76 etc. to rise up over the steering gates 115 etc. and then down on both sides of the steering gates in the y-direction to electrically contact the shielding elements 90 etc.

The modified array of FIG. 5 may be made by the process described above for the array of FIGS. 2, 3A and 3B, with certain modifications. In order to result in the floating and steering gates extend above the substrate surface, the nitride mask formed in an early step on the substrate surface is left in place as the first polysilicon layer (Poly1) is deposited. This nitride mask is used to etch trenches into the silicon surface, which in this modification are not made as deep as before. The thicknesses of the nitride mask strips, which extend in the y-direction and cover the select gate regions of the memory cells, are controlled to be equal to a dimension h, the desired distance between the top of the floating/steering gate structure and the substrate surface 49. Poly1 is then deposited over the nitride mask strips and into the substrate trenches and their vertical extension formed by the nitride strips. The floating gate spacers that result from the anisotropic etch of the Poly1 layer then extend to the top of the nitride strips, above the substrate surface by the distance h. The nitride mask strips are then later removed.

Since the nitride mask strips remain after the floating gate spacers are formed, the buried bit line diffusions may be implanted at this time, using the nitride strips and floating gates as an implant mask. Since the floating gates narrow the width of the trenches through which ions are implanted, the oxide spacers formed in the above description of the FIGS. 3A and 3B process before the Poly1 is deposited are not necessary. The added steps required to form and remove those oxide spacers can then be omitted.

Figure 6:
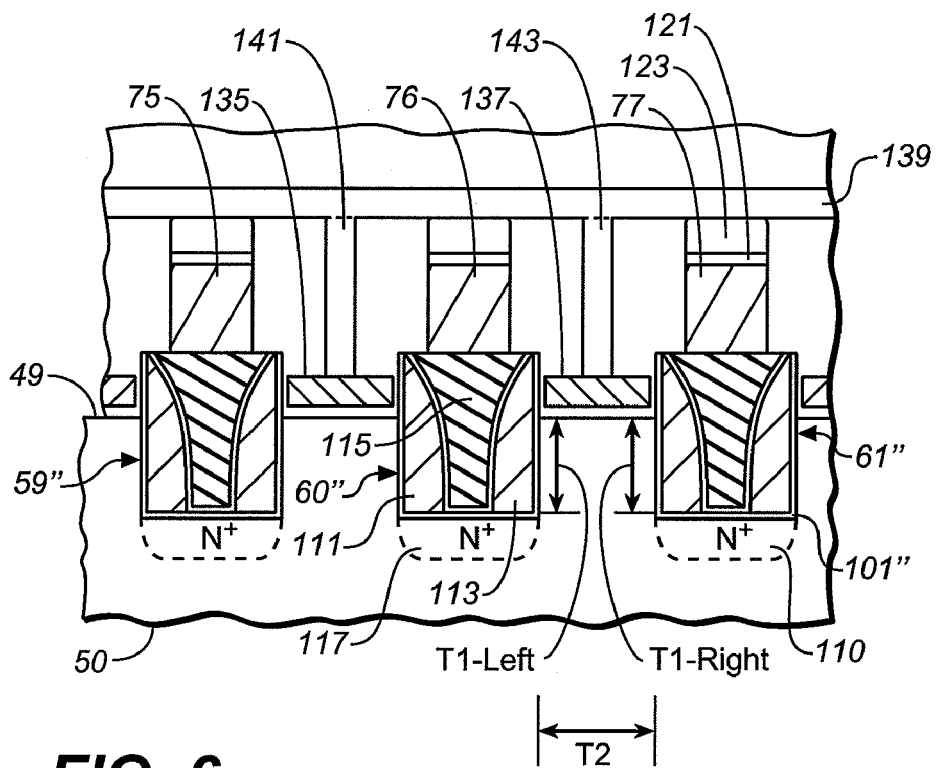
FIGS. 6 and 7 are also sectional views of the structure of FIG. 2, taken at section A-A thereof, which show modifications of the embodiment of FIG. 5.
Figure 7:
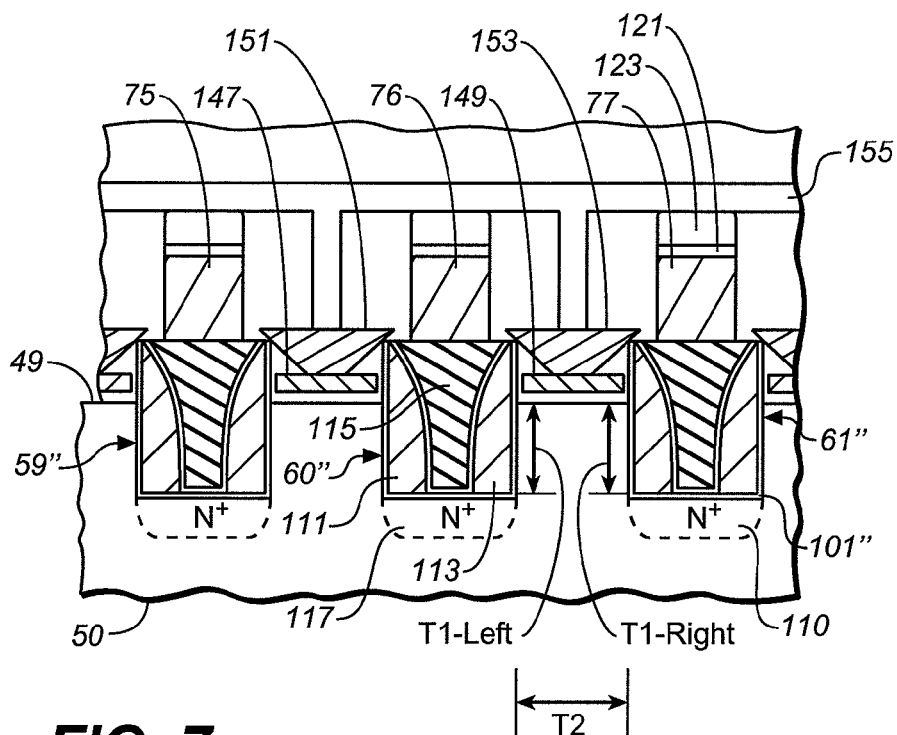

If it is desired to have the steering to floating gate coupling ratio increased but maintain a word line (select gate) to floating gate coupling ratio low, the word line and its select gate structure shown in FIG. 5 may be changed. Three different examples of select gate structures that reduce the coupling area with the floating gates are shown in FIGS. 6 and 7, wherein elements that are the same or essentially the same as those shown in FIG. 5 are identified by the same reference numbers. While reducing coupling with the floating gates, the select gate channel length T2 need not be reduced.

Referring first to FIG. 6, select gates, such as gates 135 and 137, are individually formed of a conductive material such as doped polysilicon. These select gates are then later connected together by a horizontal word line conductor 139 extending in the x-direction along a row of memory cells and downward extending conductors 141 and 143 that contact the individual select gates. The area of coupling with the floating gates, along vertical edges of the select gates, can be kept small since thin select gates can be formed. The vertical portions 141, 143 et al. can also be made of doped polysilicon while the horizontal portion 139 is made of a metal. Alternatively, all of the word line portions 139, 141, 143 et al. can be made of metal.

FIG. 7 shows a further modification wherein thin select gates 147 and 149 are formed, as in FIG. 6, followed by separately forming second layers 151 and 153 having a triangular shape in this cross-section. The triangular portions are oriented with surfaces adjacent the upper narrow edges of the floating gates, with a thin layer of dielectric between them, which facilitates erasing the floating gates to the select gates. But at the same time the coupling between the select and floating gates is minimized. The individual select gate structures are then connected by conductive word lines, such as the word line 155, which is preferably a metal, including portions descending downward to contact the select gate structures.

Although the embodiments of FIGS. 2-7 are described as utilizing dual-gate memory cells connected in a NOR architecture, as specific examples, it will be understood that the trench gate structures described may also be utilized in other memory cell array configurations.

Embodiment of a NAND Memory Cell Array

Figure 8:
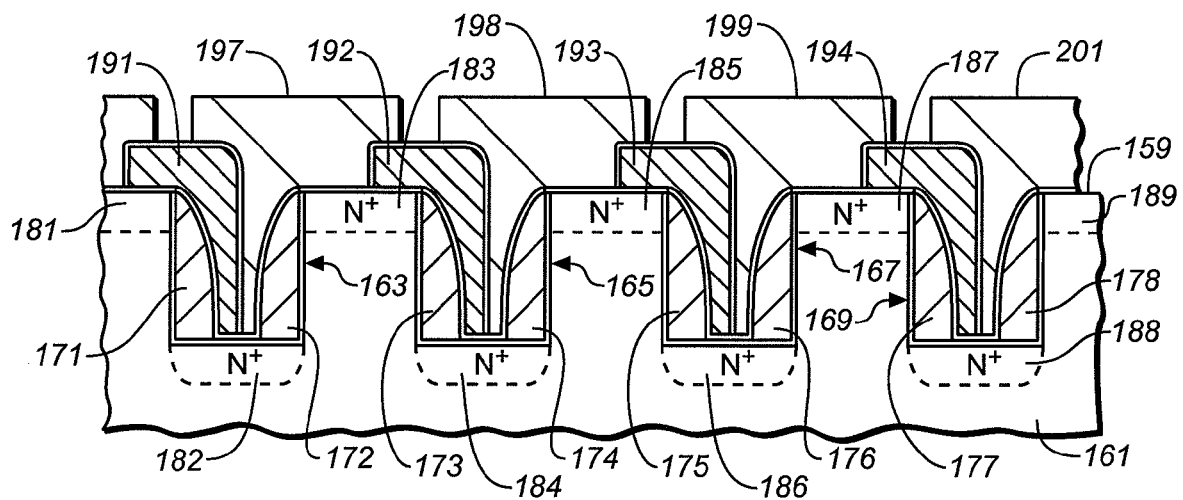
FIG. 8 is a sectional view of another embodiment taken along a string of memory cells in a NAND array.

The use of the above-described spacer techniques to form floating gates in trenches can also be used to form arrays of memory cells with a NAND architecture. One NAND embodiment is shown in FIG. 8, a cross-section through a portion of a NAND string of series connected memory cells. Formed in a surface 159 of a semiconductor substrate 161 are a series of trenches 163, 165, 167 and 169. Two floating gates are formed in each trench of spacers of doped polysilicon material (from Poly1), in the manner described above, after a dielectric layer is formed on the sidewalls and bottom of the trench. Eight such floating gates 171-178 are included in the illustration of FIG. 8. After formation of the spacer floating gates, source and drain diffusions 181-189 are formed by ion implantation. Alternatively, the ion implantation may take place before the floating gates are deposited but after the trenches are formed.

After dielectric layers are formed on exposed surfaces of the floating gates 171-178 and on the substrate surfaces 159 between trenches, word line control gates are formed to extend across the array in a direction perpendicular to that of the memory cell string. Indeed, the array is made up of a large number of such strings in parallel columns with the word lines extending across the strings along rows of memory cells. Since there is a separate word line crossing each floating gate, two such word lines need to be formed in each of the trenches 163, 165, 167 and 169, rather than the single steering gate of the earlier described embodiments.

Therefore, the word lines are formed from two layers of polysilicon that are deposited and etched in sequence. A first word line layer of polysilicon (Poly2) covers the entire array including extending into the trenches between the floating gates. A mask formed over the Poly2 layer allows its removal in a pattern that leaves a first set of word lines 191-194, every other word line along the memory cell string. After exposed surfaces of these word lines are covered with a dielectric, the next layer of polysilicon (Poly3) is deposited over the array including into the remaining space of the trenches. The Poly3 layer is then masked and etched to leave a second set of word lines 197-201 that are the remaining word lines of the array. Because the word lines are not self-aligned with other components of the strings and the trenches each contain four layers of polysilicon and five layers of dielectric, the size of the trenches in a direction along the string may in some cases need to be larger than the smallest resolution element of the process being used.

Figure 9:
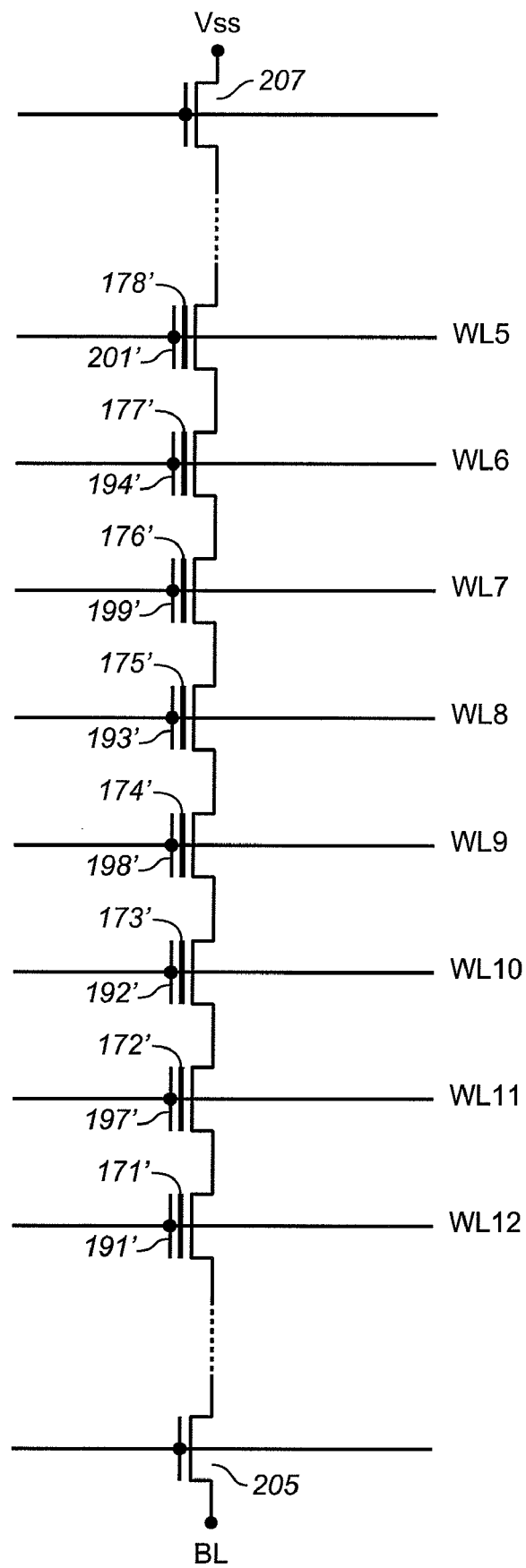
FIG. 9 is an equivalent circuit of the NAND string of FIG. 8.

An electrical equivalent circuit of the NAND memory cell string of FIG. 8 is given as FIG. 9, wherein corresponding elements are given the same reference number with a prime (') added. At the ends of each string are typically switching transistors 205 and 207 to selectively connect the string to its global bit line and a reference potential such as ground.

CONCLUSION

Although the various aspects of the present invention have been described with respect to exemplary embodiments thereof, it will be understood that the present invention is entitled to protection within the full scope of the appended claims.

It is claimed:

1. A method of making an array of non-volatile memory cells on a semiconductor substrate, comprising:
   forming a first set of trenches in a surface of the substrate that are spaced apart in a first direction and elongated in a second direction across the substrate surface, the first and second directions being orthogonal with each other,
   forming source and drain regions in at least bottom surfaces of the first set of trenches along their lengths,
   isotropically depositing first material over and into the first set of trenches,
   anisotropically removing the deposited first material in a manner to leave spacers along opposite side walls of the first set of trenches with spaces therebetween in the first direction, wherein the spacers become charge storage elements of the array of memory cells, and
   forming conductive first control gates that extend in the second direction in the spaces in the first set of trenches between the spacers and conductive first control gate lines that extend in the second direction over the first control gates to which they are electrically connected.

2. The method of claim 1, additionally comprising forming conductive shields within the substrate between the first set of trenches in the second direction, and wherein forming the conductive control gate lines includes forming said lines over and in electrical contact with the shields.

3. The method of claim 2, wherein forming the conductive shields includes forming a second set of trenches in the surface of the substrate between the first trenches in the second direction, and thereafter forming the conductive shields in the second set of trenches.

4. The method of claim 1, additionally comprising:
   prior to depositing the first material, forming a second material between the trenches in at least the first direction,
   thereafter depositing the first material over the second material and over and into the first set of trenches,
   anisotropically removing the deposited first material in a manner to leave spacers along opposed side walls of the trenches and walls of the second material above the trenches, and
   thereafter removing the deposited second material, thereby to leave the spacers extending a distance above the surface of the substrate.

5. The method of claim 4, additionally comprising:
   forming conductive second control gates in spaces between the trenches in the first direction along with second control gate lines that extend in the first direction over second control gates to which they are electrically connected, the second control gates being formed to be field coupled with both the substrate surface between the trenches in the first direction and the charge storage elements extending a distance above the surface of the substrate.

6. The method of claim 5, wherein the second control gates and second control gate lines are formed as a unitary structure by a common process.

7. The method of claim 1, wherein depositing first material includes depositing polysilicon, wherein the resulting charge storage element spacers of polysilicon become conductive floating gates.

8. The method of claim 1, wherein the forming of said conductive first control gates and conductive first control gate lines includes electrically connecting said conductive first control gates and conductive first control gate lines.

9. The method of claim 1, further comprising forming select gates in the first direction and outside the trenches and connecting the select gates to word lines elongated in the first direction and spaced apart in the second direction.

10. A method of making an array of non-volatile memory cells on a semiconductor substrate, comprising:

forming trenches into a surface of the substrate that are spaced apart in a first direction and elongated in a second direction across the substrate surface, the first and second directions being orthogonal with each other, forming source and drain regions in at least bottom surfaces of the trenches along their lengths, depositing first polysilicon material across the substrate and into the first set of trenches, anisotropically removing the deposited first polysilicon material in a manner to leave conductive spacers along opposite side walls of the trenches with spaces therebetween in the first direction, forming control gates in the spaces between the spacers, separating the spacers into floating gates, and forming select gates over the substrate surface in between the trenches in the first direction and connecting them to word lines elongated in the first direction and spaced apart in the second direction.

11. A method of making an array of non-volatile memory cells on a semiconductor substrate, comprising:

forming a first set of trenches into a surface of the substrate that are spaced apart in a first direction and elongated in a second direction across the substrate surface, the first and second directions being orthogonal with each other, forming source and drain regions in at least bottom surfaces of the first set of trenches along their lengths, depositing first polysilicon material across the substrate and into the first set of trenches, anisotropically removing the deposited first polysilicon material in a manner to leave regions within the first set of trenches along opposite side walls that do not extend outside of the trenches in the first direction but which leave spaces between the polysilicon regions in the first direction, forming second polysilicon material in the spaces within the first set of trenches, forming a second set of trenches into the substrate surface and first and second polysilicon material that are elongated in the first direction and spaced apart in the second direction, a depth of the second set of trenches being substantially equal to a depth of the first set of trenches, thereby to separate the side wall regions of the first polysilicon into individual floating gates, forming conductive material in the second set of trenches between the floating gates in the second direction, forming strips of conductive material elongated in the second direction and spaced apart in the first direction to pass over and contact the second polysilicon material in the first set of trenches and the conductive material in the second set of trenches, and forming select gates over the substrate surface in between the first set of trenches in the first direction and connecting them to word lines elongated in the first direction and spaced apart in the second direction.

\* \* \* \* \*